United States Patent [19]

Fraas

[11] Patent Number: 4,725,559
[45] Date of Patent: Feb. 16, 1988

[54] PROCESS FOR THE FABRICATION OF A GALLIUM ARSENIDE GRATING SOLAR CELL

[75] Inventor: Lewis M. Fraas, El Sobrante, Calif.

[73] Assignee: Chevron Research Company, San Francisco, Calif.

[21] Appl. No.: 922,368

[22] Filed: Oct. 23, 1986

[51] Int. Cl.$^4$ ............... H01L 31/18; H01L 31/06
[52] U.S. Cl. .................................. 437/5; 136/255; 136/262; 357/30
[58] Field of Search .............. 136/255, 262; 357/30, 357/20; 29/572; 437/5

[56] References Cited

PUBLICATIONS

V. G. Weiser et al, *Conference Record*, 18th IEEE Photovolatic Specialists Conf. (1985), Published Apr. 1986, pp. 100–104.
R. P. Gale et al, *Conference Record*, 17th IEEE Photovoltaic Specialists Conf. (1984), pp. 1422–1425.

*Primary Examiner*—Aaron Weisstuch
*Attorney, Agent, or Firm*—S. R. La Paglia; E. J. Kelling; E. A. Schaal

[57] ABSTRACT

A photovolatic device is disclosed comprising a p-type conductive substrate, a sandwich of p-type $Al_yGa_{(1-y)}As$ bottom layer/p-type GaAs base layer/p-type $Al_yGa_{(1-y)}As$ top layer (wherein the surface area of the p-type $Al_yGa_{(1-y)}As$ top layer is less than the surface area of the p-type GaAs base layer, a layer of n+-type GaAs emitter contacting the surface of the p-type GaAs base layer (wherein the surface area of the layer of n+-type GaAs emitter is less than one-tenth the surface area of the p-type GaAs base layer), an insulating layer contacting the surface of the p-type $Al_yGa_{(1-y)}As$ top layer, and means for forming electrical contacts to the substrate and the incident surface of the n+-type GaAsemitter layer.

6 Claims, 1 Drawing Figure

PROCESS FOR THE FABRICATION OF A GALLIUM ARSENIDE GRATING SOLAR CELL

This invention relates to photovoltaic cells. More specifically, this invention relates to grating photovoltaic cells having multiple small junctions.

BACKGROUND OF THE INVENTION

Photovoltaic cells such as silicon or III-V compound solar cells are capable of converting solar radiation into usable electrical energy. The electrical energy conversion occurs as a result of what is well known in the solar cell field as the photovoltaic effect. Solar radiation impinging on a solar cell is absorbed by the semiconductor layer, which generates electrons and holes. The electrons and holes are separated by a built-in electric field, for example, a rectifying junction such as a PN junction in the solar cell. The electrons flow towards the N-type region and the holes flow towards the P-type region. The separation of the electrons and holes across the rectifying junction results in the generation of an electric current known as the photocurrent and an electric voltage known as the photovoltage.

Photovoltaic researchers have been investigating various paths toward the generation of electricity from sunlight on an economic basis which can compete with conventional means of generating electricity. The research has focused mainly on two alternatives for economically making electricity from solar cells. For the first alternative, researchers are trying to make low-cost noncrystalline solar cells, such as amorphous silicon cells, and thereafter deploy the cells as large area flat plate arrays. For the second alternative, researchers use a plastic lens as the large area collector in combination with smaller but higher efficiency solar cells. The lens (or array of lenses) focuses the sunlight onto the small area single crystal solar cell (or array of solar cells).

This invention focuses on improved high efficiency single crystal solar cells of the second alternative although if the materials costs were lowered, the cell could be used in the first alternative. To date, the solar cells with the highest conversion efficiencies have been fabricated from the III-V compound semiconductor material, GaAs.

At the 18th Institute of Electrical and Electronic Engineers Photovoltaic Specialist Conference (1985), high efficiency dot junction silicon solar cells were described and theoretical calculations were given, indicating that reduced junction area GaAs solar cells would have higher voltages and, consequently, higher efficiencies. However, a GaAs cell structure and a fabrication scheme were not defined.

SUMMARY OF THE INVENTION

The photovoltaic device of the present invention comprises a high diffusion length p-type GaAs base layer sandwiched between two AlGaAs surface passivation layers. This epi structure is grown on a conductive substrate, such as a p-type GaAs wafer. The p-type contact is made as a continuous metallization on the back side of the wafer. The cell is unique in that it uses dot or line local n+-type GaAs emitter regions on the top side. These local junctions are made with a unique localized epitaxial deposition process.

This process begins by growing the sandwich of AlGaAs/GaAs/AlGaAs on a conductive substrate in a Chemical Vapor Deposition (CVD) reactor. This sandwich structure is then coated with a dielectric (such as $Si_3N_4$) which serves as an insulating layer and as an anti-reflection (AR) coating. Using photolithography, holes or lines are then etched through the AR and top AlGaAs layer, exposing GaAs regions. The photoresist is then removed, and the structure is returned to the (CVD) reactor and heated. Then gallium is deposited by decomposing triethyl gallium (TEGa). The gallium migrates to the open regions where it wets the GaAs and stays. It does not wet the AR coating. Triethyl tin (TESn) is introduced in an appropriate amount with the TEGa for n+-type doping. The TEGa/TESn flow is then terminated, and the Ga:Sn is exposed to $As_2$ by turning on $AsH_3$ flow into the reactor. The result is $As_2$ vapor-controlled liquid phase epitaxy (LPE). The Ga:Sn is consumed with the growth of n+ GaAs. A metal grid is then formed contacting the surface of the n+-type GaAs emitter. Cell fabrication is completed with the formation of this metal grid.

BRIEF DESCRIPTION OF THE DRAWINGS

In order to facilitate the understanding of this invention, reference will now be made to the appended drawing of preferred embodiments of the present invention. The drawing (FIG. 1) is exemplary only, and should not be construed as limiting the invention.

DETAILED DESCRIPTION OF THE INVENTION

Figure 1:
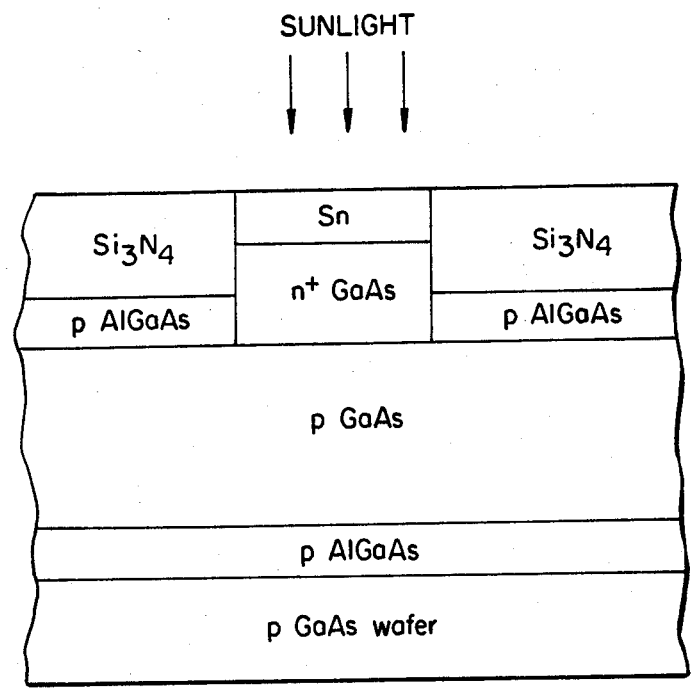
FIG. 1 illustrates a cross-sectional view of one embodiment of the present invention.

Recent calculations have shown that significant open circuit voltage gains are possible with a dot grating junction geometry. A grating cell is a cell in which the junction (emitter) area has been reduced to a fraction of the total front (or rear) surface area. The purpose of going to a grating geometry is to secure an increase in voltage while maintaining a current level characteristic of a planar cell. The two simplest grating geometries are the line junction and the dot junction configurations. In the line junction the emitter is composed of an array of parallel lines and in the dot junction it is composed of an array of equally spaced dots.

It has been shown that, because the emitter volume varies with the emitter area, the saturation current component from that region decrease linearly with the junction area. A cell with a junction composed of an array of dots whose aggregate area is only 1% of the total cell area, for instance, would have its emitter component reduced by a factor of 100 as compared to a planar cell with the same total area. The dot grating geometry thus has the potential for producing significant increased in cell voltage.

The present invention is a grating photovoltaic device having a high diffusion length p-type GaAs base layer sandwiched between two AlGaAs surface passivation layers. This epi structure is grown on a conductive substrate. The cell is unique in that it uses dot or line local n+-type GaAs emitter regions on the top side of the structure, wherein the surface area of the n+-type GaAs emitter is less than one-tenth the surface area of the p-type GaAs base layer.

FIG. 1 illustrates a cross-sectional view of one embodiment of the present invention.

At the bottom of the device of the present invention is a p-type conductive substrate. A conductive substrate can be any material that enables the subsequently deposited semiconductor layers to grow in a crystal configuration suitable for solar cells. Suitable examples are crystalline GaAs, Ge, and the like. The conductive substrate in FIG. 1 is a p-type GaAs wafer.

A sandwich of p-type $Al_yGa_{(1-y)}As$/p-type GaAs base/p-type $Al_yGa_{(1-y)}As$ is deposited on the conductive substrate. This deposition can occur in a CVD reactor. The sandwich of p-type $Al_yGa_{(1-y)}As$/p-type GaAs base/p-type $Al_yGa_{(1-y)}As$ consists of:

(a) a p-type $Al_yGa_{(1-y)}As$ bottom layer contacting the substrate;

(b) a p-type GaAs base layer contacting the interface of the p-type $Al_yGa_{(1-y)}As$ bottom layer opposite to the surface contacting the substrate; and (c) a p-type $Al_yGa_{(1-y)}As$ top layer contacting the interface of the p-type GaAs base layer opposite to the interface contacting the p-type $Al_yGa_{(1-y)}As$ bottom layer, where y in both layers of p-type $Al_yGa_{(1-y)}As$ preferably has the value of about 0.8.

The surface area of the p-type $Al_yGa_{(1-y)}As$ top layer is made less than the surface area of the p-type GaAs base layer by etching out areas in the top layer, thereby exposing regions of the surface of the base layer opposite to the interface contacting the bottom layer. The surface area of the exposed regions of GaAs is less than one-tenth the surface area of the total base layer. One method of accomplishing this is by coating that top layer with a dielectric (such as $Si_3N_4$) which serves as an insulating layer and as an AR coating, then using photolithography to etch either holes or lines through the AR coating and p-type $Al_yGa_{(1-y)}As$ top layer. The photoresist used in the photolithography is then removed.

N+-type GaAs emitter is deposited in those exposed regions of p-type GaAs base, wherein the surface area of the deposited n+-type GaAs emitter is less than one-tenth the surface area of the base layer. When photolithography is used to etch either holes or lines through the AR coating and top layer, n+-type GaAs emitter comprises either a plurality of dot (or line) junctions.

One method of depositing the n+-type GaAs emitter is by depositing gallium on the exposed GaAs regions by decomposing triethyl gallium, wherein triethyl tin is introduced in an appropriate amount with the triethyl gallium for n+-type doping, then exposing the deposited Ga:Sn to $As_2$ or $AsH_3$ by flowing $As_2$ or $AsH_3$ over the deposited Ga:Sn to form n+-type GaAs emitter. In this method, the structure is returned to the CVD reactor and heated. Then gallium is deposited by decomposing TEGa. The gallium migrates to the open regions where it wets the GaAs and stays. It does not wet the AR coating. TESn is introduced in an appropriate amount with the TEGa for n+-type doping. The TEGa/TESn flow is then terminated, and the Ga:Sn is exposed to $As_2$ by turning on $AsH_3$ flow into the hot reactor. The result is $As_2$ vapor-controlled liquid phase epitaxy (LPE). The Ga:Sn is consumed with the growth of n+ GaAs.

The final element of the present invention are electrical contacts to the substrate and the incident surface of the n+-type GaAs emitter.

While the present invention has been described with reference to specific embodiments, this application is intended to cover those various changes and substitutions which may be made by those skilled in the art without departing from the spirit and scope of the appended claims.

What is claimed is:

1. A process of fabricating a solar cell comprising:
   (a) growing a sandwich of p-type $Al_yGa_{(1-y)}As$ bottom layer/p-type GaAs base layer/p-type $Al_yGa_{(1-y)}As$ top layer on a p-type conductive substrate;
   (b) coating said sandwich with a dielectric which serves as an AR coating;
   (c) using photolithography to etch regions through the AR coating and top p-type $Al_yGa_{(1-y)}As$ layer, thereby exposing GaAs regions;
   (d) depositing gallium on said exposed GaAs regions by decomposing triethyl gallium, wherein triethyl tin is introduced in an appropriate amount with the triethyl gallium for n+-type doping;
   (e) exposing the deposited Ga:Sn to a gas containing either $As_2$ or $AsH_3$ by flowing said gas over the deposited Ga:Sn to form n+-type GaAs emitter; and
   (f) forming electrical contacts to said substrate and the incident surface of said n+-type GaAs emitter.

2. The process according to claim 1 wherein y has the value of about 0.8.

3. The process according to claim 1 wherein said p-type conductive substrate is a GaAs wafer.

4. The process according to claim 1 wherein said insulating layer is a layer of $Si_3N_4$.

5. The process according to claim 1 wherein said n+-type GaAs emitter comprises a plurality of dot junctions.

6. A process of fabricating a solar cell comprising:
   (a) growing a sandwich of p-type $Al_{0.8}Ga_{0.2}As$ bottom layer/p-type GaAs base layer/p-type $Al_{0.8}Ga_{0.2}As$ top layer on a p-type GaAs wafer substrate;
   (b) coating said sandwich with $Si_3N_4$ which serves as an AR coating;
   (c) using photolithography to etch dots through the AR coating and top p-type $Al_{0.8}Ga_{0.2}As$ layer, thereby exposing GaAs regions;
   (d) depositing gallium on said exposed GaAs regions by decomposing triethyl gallium, wherein triethyl tin is introduced in an appropriate amount with the triethyl gallium for n+-type doping;
   (e) exposing the deposited Ga:Sn to a gas containing either $As_2$ or $AsH_3$ by flowing said gas over the deposited Ga:Sn to form n+-type GaAs emitter; and
   (f) forming electrical contacts to said substrate and the incident surface of said n+-type GaAs emitter.

* * * * *